US 9,831,845 B2

(12) United States Patent
Tanaka

(10) Patent No.: US 9,831,845 B2
(45) Date of Patent: Nov. 28, 2017

(54) SINGLE CONVERSION RECEIVER AND COMMUNICATION SYSTEM INCLUDING SAME

(71) Applicant: SII Semiconductor Corporation, Chiba (JP)

(72) Inventor: Toshiyuki Tanaka, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/278,940

(22) Filed: Sep. 28, 2016

(65) Prior Publication Data

US 2017/0093354 A1    Mar. 30, 2017

(30) Foreign Application Priority Data

Sep. 30, 2015 (JP) ................. 2015-194566

(51) Int. Cl.
*H03G 3/30* (2006.01)
*H04B 1/00* (2006.01)
(Continued)

(52) U.S. Cl.
CPC ............. *H03G 3/3036* (2013.01); *H03F 3/19* (2013.01); *H03G 3/3068* (2013.01);
(Continued)

(58) Field of Classification Search
CPC .......... H04B 1/26; H03B 19/00; H03B 21/00; H03L 7/1974; G01S 19/36
See application file for complete search history.

(56) References Cited

U.S. PATENT DOCUMENTS 5,493,710 A * 2/1996 Takahara ................. H03J 7/065
455/182.2
5,832,375 A * 11/1998 Leisten .................... G01S 19/32
455/196.1
(Continued)

FOREIGN PATENT DOCUMENTS

JP    2011-168934 A    6/2001

*Primary Examiner* — Aristocratis Fotakis
(74) *Attorney, Agent, or Firm* — Brinks Gilson & Lione

(57) ABSTRACT

There is provides a single conversion receiver and a communication system having wide occupied frequency bands and good receiving sensitivity. The single conversion receiver includes: a first bandpass filter that lets only a desired band of a received RF signal pass through; a first mixer that converts the RF signal passing through the first bandpass filter into a first intermediate frequency signal; a second bandpass filter that lets only a band of a desired frequency channel of the first intermediate frequency signal pass through; a quadrature demodulator that converts the first intermediate frequency signal to baseband signals composed of an I phase and a Q phase; an oscillator that generates a first local signal $2^M$ times the center frequency of the second bandpass filter (where M is an integer); a fractional-N PLL frequency synthesizer that generates a second local signal with a frequency non-integer times the first local signal and supplies the second local signal to the first mixer; and a first frequency divider that divides the frequency of the first local signal by ($2^M$) to generate a third local signal and a fourth local signal having 90 degree phase difference from the third local signal, and supplies the third local signal and the fourth local signal to the quadrature demodulator.

4 Claims, 3 Drawing Sheets

(51) Int. Cl.
*H04B 1/16* (2006.01)
*H03F 3/19* (2006.01)
*H03L 7/197* (2006.01)

(52) U.S. Cl.
CPC ......... *H03L 7/1974* (2013.01); *H04B 1/0017* (2013.01); *H04B 1/16* (2013.01); *H03F 2200/165* (2013.01); *H03F 2200/294* (2013.01); *H03F 2200/336* (2013.01); *H03F 2200/451* (2013.01)

(56) References Cited

U.S. PATENT DOCUMENTS

| | | | | |
|---|---|---|---|---|
| 5,884,214 | A * | 3/1999 | Krasner | G01C 21/206 701/470 |
| 6,167,245 | A * | 12/2000 | Welland | H03L 7/085 331/36 C |
| 6,282,413 | B1 * | 8/2001 | Baltus | H03D 3/007 455/255 |
| 2004/0097214 | A1 * | 5/2004 | Gard | H04B 1/30 455/323 |
| 2005/0001937 | A1 * | 1/2005 | Lee | H03D 7/165 348/731 |
| 2005/0080564 | A1 * | 4/2005 | Tso | G01S 19/36 375/130 |
| 2006/0064260 | A1 * | 3/2006 | Stein | G01R 23/20 702/76 |
| 2006/0211399 | A1 * | 9/2006 | Tso | G01S 19/36 455/339 |

* cited by examiner

SINGLE CONVERSION RECEIVER AND COMMUNICATION SYSTEM INCLUDING SAME

RELATED APPLICATIONS

This application claims priority under 35 U.S.C. §119 to Japanese Patent Application No. 2015-194566 filed on Sep. 30, 2015, the entire content of which is hereby incorporated by reference.

BACKGROUND OF THE INVENTION

Field of the Invention

The present invention relates to a receiver in a digital radio communication system, and more specifically to a single conversion receiver and a communication system.

Background Art

FIG. 3 is a block diagram illustrating the structure of a conventional single conversion receiver.

The conventional single conversion receiver includes an input terminal 31 to which a received RF signal is input, a bandpass filter 32, an RF amplifier 33, a mixer 34, an IF amplifier 35, mixers 36 and 37, a channel selection control circuit 38, an oscillator 39, a 1/N frequency dividing circuit 40, a ¼ frequency dividing circuit 41, and lowpass filters 42 and 43.

The received RF signal is input to the RF amplifier 33 through the bandpass filter 32, where only a desired band of RF signal is amplified. The center frequency of the bandpass filter 32 is controlled by the channel selection control circuit 38. The oscillator 39 outputs a local signal. The frequency of the local signal is controlled by the channel selection control circuit 38 according to the frequency of the RF signal. The mixer 34 multiplies the RF signal output from the RF amplifier 33 and the local signal output from the oscillator 39 together. The output of the mixer 34 is amplified by the IF amplifier 35, and input to the mixers 36 and 37.

The local signal output from the oscillator 39 is set to be 4N/(4N±1) times the frequency of the RF signal (where N is an integer). The frequency of the output signal from the mixer 34 is 1/(4N±1) times the frequency of the RF signal. The local signal output from the oscillator 39 is input to the 1/N frequency dividing circuit 40 and the ¼ frequency dividing circuit 41. The frequency of the output signal becomes 1/(4N±1) times the frequency of the RF signal, and is input to the mixers 36 and 37. Thus, quadrature detection is performed by the mixers 36 and 37, and respective output signals are output to the lowpass filters 42 and 43. Then, the lowpass filters 42 and 43 remove unwanted harmonic components generated by the multiplication and noise components outside of the receiving band to output baseband signals from respective output terminals (for example, see Patent Document 1).

[Patent Document 1] Japanese Patent Application Laid-Open No. 2001-168934

SUMMARY OF THE INVENTION

However, the conventional single conversion receiver has the following problem.

An RF signal whose frequency is converted to an intermediate frequency and output from the mixer 34 is such that the frequency of a third-order intermodulation distortion component becomes the same frequency as the intermediate frequency. Therefore, since the narrowband lowpass filters 42 and 43 provided in the baseband cannot remove this distortion component, the bit error rate increases due to the influence of this distortion component and hence the receiving characteristics are degraded.

For a PLL frequency synthesizer used as the oscillator 39, it is also required that a phase comparison frequency (reference frequency) is equivalent to receive channel spacing. In the case of radio communication using frequency channels with receive channel spacing, for example, from ten kHz to several hundreds kHz, since a multiple number of the PLL frequency synthesizer increases, phase noise of a local signal increases. Thus, there is a problem that the bit error rate increases due to the influence of this noise and hence receiving sensitivity characteristics are degraded.

The present invention has been made to solve the above problem, and it is an object thereof to provide a single conversion receiver with good receiving sensitivity.

In order to solve the above problem, a single conversion receiver of the present invention has the following structure.

The structure includes: a first bandpass filter that lets only a desired band of a received RF signal pass through; a first mixer that converts the RF signal passing through the first bandpass filter into a first intermediate frequency signal; a second bandpass filter that lets only a band of a desired frequency channel of the first intermediate frequency signal pass through; a quadrature demodulator that converts the first intermediate frequency signal to baseband signals composed of an I phase and a Q phase; an oscillator that generates a first local signal 2^M times the center frequency of the second bandpass filter (where M is an integer); a fractional-N PLL frequency synthesizer that generates a second local signal with a frequency non-integer times the first local signal and supplies the second local signal to the first mixer; and a first frequency divider that divides the frequency of the first local signal by (2^M) to generate a third local signal and a fourth local signal having 90 degree phase difference from the third local signal, and supplies the third local signal and the fourth local signal to the quadrature demodulator.

According to the single conversion receiver of the present invention, it is possible to prevent the degradation of receiving sensitivity characteristics due to the influence of cross-modulation distortion caused by the mixers.

Further, use of the fractional-N PLL frequency synthesizer improves phase noise, and hence the receiving sensitivity characteristics are improved. Further, since the attenuation characteristics of the bandpass filters are mitigated, low-order filters are usable. This leads to making the circuit size small, and hence reducing power consumption.

Further, since a symbol rate SR of a modulated signal is set to be (2^M)/(N·P) times the center frequency F_IF (where P is an integer of 2 or more), the amount of operation upon demodulation can be reduced, resulting in reducing the size and consumption power of the digital circuit that performs this processing.

DETAILED DESCRIPTION OF THE PREFERRED EMBODIMENT

Figure 1:
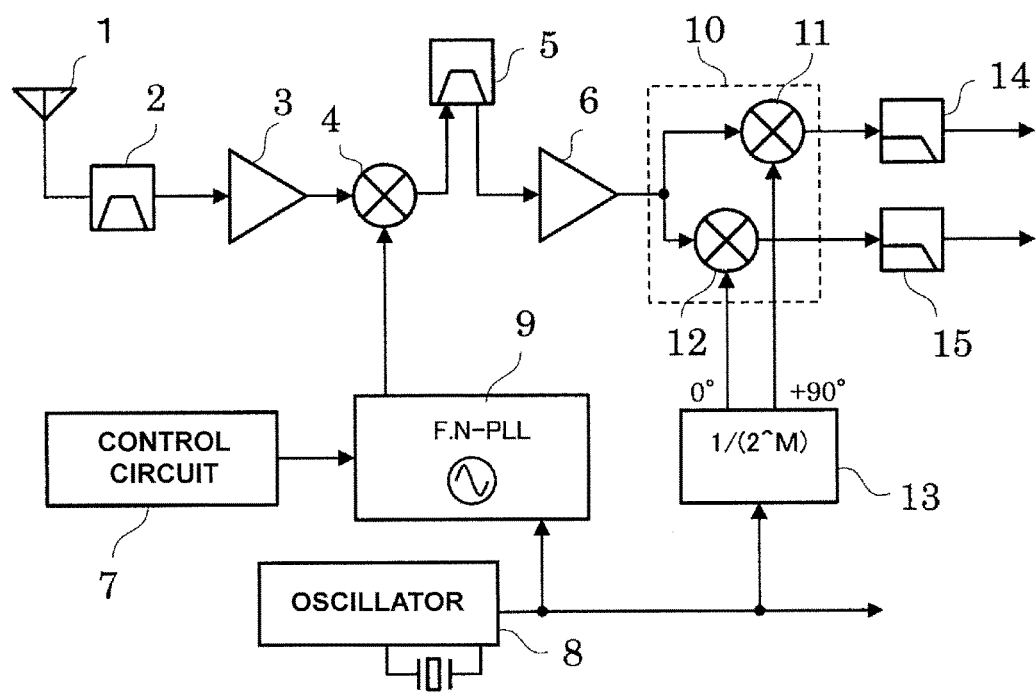
FIG. 1 is a block diagram illustrating the structure of a single conversion receiver of an embodiment.

It is assumed that a single conversion receiver of the present invention uses frequency channels having occupied frequency bands and channel spacing from several tens kHz to several hundreds kHz to be applied to a receiving unit in a digital radio communication system using FSK modulation or PSK modulation with a communication rate of several tens kbps to several hundreds kbps. Specifically, the single conversion receiver is suitable for use in a radio system transmitting a small amount of information such as a radio sensor network.

The single conversion receiver of the embodiment will be described below with reference to the accompanying drawings. The same elements in respective drawings are given the same reference numerals to omit redundant description.

FIG. 1 is a block diagram illustrating the structure of the single conversion receiver of the embodiment.

The single conversion receiver of the embodiment includes a bandpass filter 2 as a first bandpass filter, an amplifier 3 as a low-noise amplifier, a mixer 4, a bandpass filter 5 as a second bandpass filter, an amplifier 6 as an intermediate-frequency amplifier, a control circuit 7, an oscillator 8, a fractional-N PLL frequency synthesizer 9, a quadrature demodulator 10 having a mixer 11 as an I-phase frequency mixer and a mixer 12 as a Q-phase frequency mixer, a frequency divider 13 as a 1/(2^M) frequency divider, and lowpass filters 14 and 15 as baseband receiving filters.

An antenna 1 is connected to an input terminal of the bandpass filter 2, and the output terminal of the bandpass filter 2 is connected to an input terminal of the amplifier 3. An output terminal of the amplifier 3 and an output terminal of the fractional-N PLL frequency synthesizer 9 are connected to input terminals of the mixer 4. An output terminal of the mixer 4 is connected to an input terminal of the bandpass filter 5, and an output terminal of the bandpass filter 5 is connected to an input terminal of the amplifier 6. Input terminals of the quadrature demodulator 10 are connected to an output terminal of the amplifier 6 and output terminals of the frequency divider 13, and two output terminals of the quadrature demodulator 10 are connected to the lowpass filters 14 and 15, respectively. The control circuit 7 and the oscillator 8 are connected to the fractional-N PLL frequency synthesizer 9. The oscillator 8 is also connected to the frequency divider 13.

Next, the operation of the single conversion receiver of the embodiment will be described with reference to FIG. 1.

Here, operation of a signal path in which an RF signal received at the antenna 1 of the single conversion receiver of the embodiment is converted to baseband signals will be described.

Only a desired receiving band is selected by the bandpass filter 2 so that the RF signal (F_RF1) received at the antenna 1 will become an RF signal (F_RF2). The RF signal (R_RF2) passing through the bandpass filter 2 is amplified by the amplifier 3 and converted by the mixer 4 into an intermediate frequency signal (F_IF1).

The narrowband bandpass filter 5 that lets only the occupied frequency band of the receive channel pass through is provided at the subsequent stage of the mixer 4 to avoid the degradation of receiving sensitivity due to cross-modulation. Providing this bandpass filter 5 is a first feature of the receiver of the present invention. The bandpass filter 5 lets only a signal of the receive channel pass through while removing all frequency components of adjacent channels capable of being separated by 2Δ from a mistuned frequency Δ of the intermediate frequency signal (F_IF). This inhibits cross-modulation caused by the non-linearity of the amplifier 6 and the quadrature demodulator 10 located at subsequent stages of the bandpass filter 5, and hence improves the receiving sensitivity characteristics.

The bandpass filter 5 is not limited to a filter type and a specific frequency as long as the center frequency is in a region of several tens MHz and the passband width has excellent attenuation characteristics from several tens kHz to several hundreds kHz.

The intermediate frequency signal (F_IF2) passing through the bandpass filter 5 is amplified by the amplifier 6 to become an intermediate frequency signal (F_IF3), and converted by the quadrature demodulator 10 into a baseband signal (BI1) and a baseband signal (BQ1). The baseband signal (BI1) and the baseband signal (BQ1) are converted to a baseband signal (BI2) and a baseband signal (BQ2) by passing through the lowpass filters 14 and 15, respectively.

At this time, although a component as the sum of the frequency of the intermediate frequency signal (F_IF3) and the frequency of a local signal (F_LO2I) or a local signal (F_LO2Q), i.e., a component twice the intermediate frequency signal is contained in the baseband signal (BI1) and the baseband signal (BQ1), all the components of the adjacent channels that become obstacles at the stage of passing through the bandpass filter 5 are removed in advance. Thus, since the lowpass filters 14 and 15 only have to attenuate the component twice the intermediate frequency, low-order lowpass filters can be used.

In the conventional single conversion receiver provided with no bandpass filter 5, the lowpass filters at the subsequent stage of the quadrature demodulator have a role in eliminating the adjacent channels. Therefore, the lowpass filters are required to be high-order lowpass filters whose cutoff frequency is equal to the occupied frequency width of the baseband signals and having excellent attenuation characteristics in order to eliminate the influence of the adjacent channels, and this results in a large circuit size.

Thus, since the single conversion receiver of the embodiment uses the narrowband bandpass filters at the intermediate frequency stage, the baseband lowpass filters have the advantage of being able to reduce the area significantly compared with the conventional system.

Next, the operation of a local signal generation unit that generates a local signal used in converting an RF signal of the single conversion receiver of the embodiment into an intermediate frequency signal will be described.

The oscillator 8 outputs an oscillation signal (F_XTL) having a frequency 2^M times the frequency of the intermediate frequency signal (F_IF) of the bandpass filter 5 (where M is an integer of 1 or more). The oscillation signal (F_XTL) is input to the fractional-N PLL frequency synthesizer 9 and the frequency divider 13. The control circuit 7 outputs a control signal (dividing number data) to set a frequency in the fractional-N PLL frequency synthesizer 9.

The fractional-N PLL frequency synthesizer 9 outputs a local signal (F_LO1) based on the input oscillation signal (F_XTL) and dividing number data. The mixer 4 converts the RF signal (F_RF2) amplified by the local signal (F_LO1) into the intermediate frequency signal (F_IF1).

The frequency divider 13 divides the frequency of the input oscillation signal (F_XTL) by 2^M (where M is an integer of 1 or more), and outputs a local signal (F_LO2I) and a local signal (F_LO2Q) having 90 degree phase difference from the local signal (F_LO2I). The quadrature demodulator 10 has the mixers 11 and 12 convert the intermediate frequency signal (F_IF3), and the local signal (F_LO2I) and the local signal (F_LO2Q) into the baseband signal (BI1) and the baseband signal (BQ1), respectively, and outputs the baseband signal (BI1) and the baseband signal (BQ1).

The local signal generation unit of the embodiment sets the oscillation frequency of the oscillation signal (F_XTL) of the oscillator 8 to a frequency $2^M$ times the intermediate frequency signal (F_IF) (where M is an integer of 1 or more). Therefore, the local signal generation unit can generate the local signal (F_LO2I) and the local signal (F_LO2Q) having 90 degree phase difference from the local signal (F_LO2I), which are supplied to the quadrature demodulator 10, merely by dividing the frequency of the oscillation signal (F_XTL) of the oscillator 8 by $2^M$ (where M is an integer of 1 or more). Thus, the circuit size of the local signal generation unit becomes small compared with the conventional technique.

In order to make the phase difference between the two local signals (F_LO2I and F_LO2Q) exactly 90 degrees, it is desired to set the value M to 2 or more, i.e., set the dividing number of the frequency divider 13 is ¼ or more. The oscillator 8 is so designed that the duty ratio of the oscillation signal (F_XTL) will be close to 50% when the value M is 1, i.e., when the dividing number of the frequency divider 13 is ½, and two ½ frequency dividers operating at the rising and falling edges are used in the frequency divider 13 to be able to create the 90 degree phase difference.

The local signal generation unit of the embodiment is also provided with the fractional-N PLL frequency synthesizer 9 as a local signal generation circuit. The fractional-N PLL frequency synthesizer 9 can generate a frequency obtained by multiplying a reference frequency by any ratio (including numeric values after the decimal point). Thus, since the input oscillation signal (F_XTL) is used as a reference signal without dividing the frequency of the input oscillation signal (F_XTL) to be able to generate a signal non-integer times the reference signal, the multiple number from the reference signal may be small. In other words, since the phase noise of the generated local signal (F_LO1) becomes small, the receiving performance of the single conversion receiver is improved.

When the oscillation frequency of the oscillator 8 is 42.8 MHz in a radio system with frequency channel spacing of 200 kHz, the amount of improvement A of the phase noise in this case is 46.6 dB from Equation 1 below.

$$A = 20 \log_{10}(42.8E6/200E3) \quad (1)$$

Figure 2:
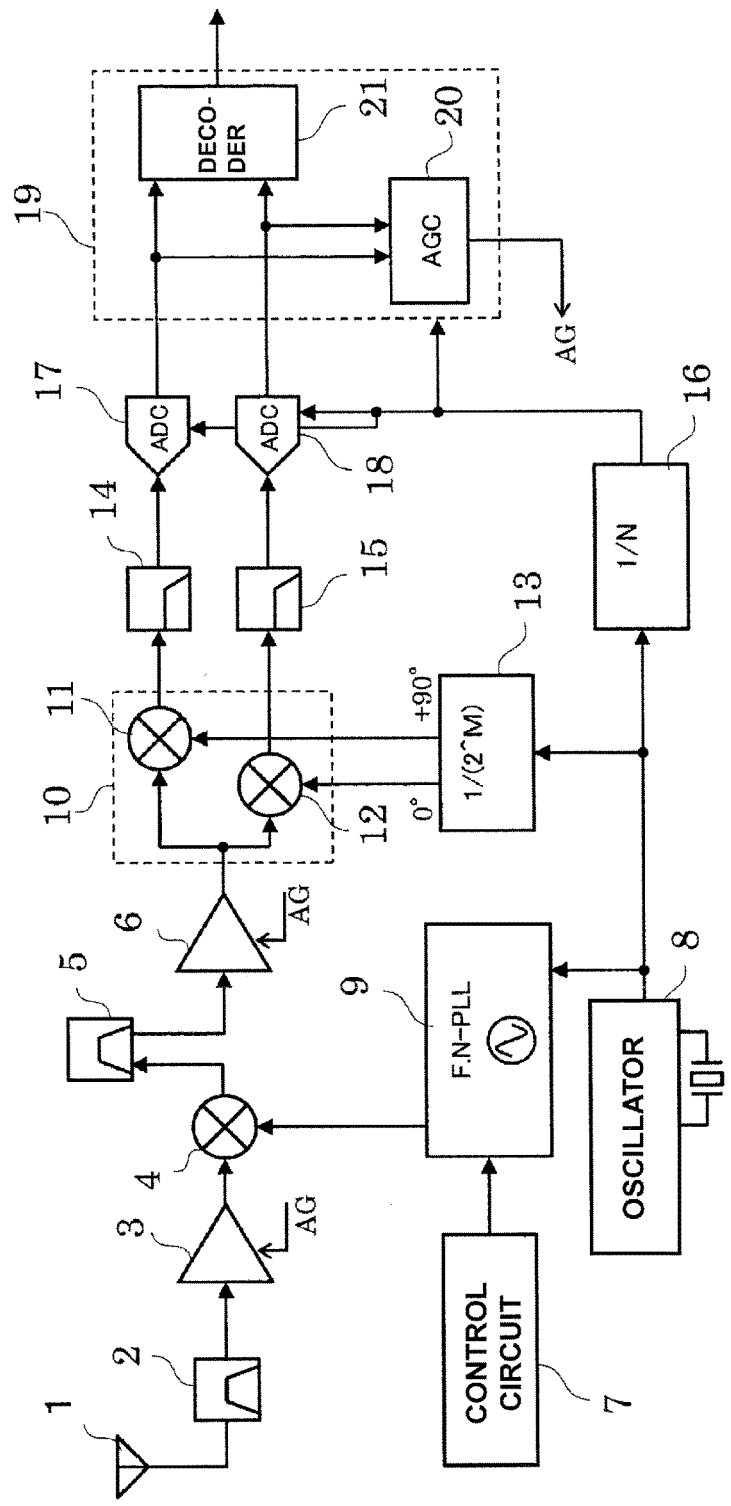
FIG. 2 is a block diagram illustrating the structure of the single conversion receiver of the embodiment.
Figure 3:
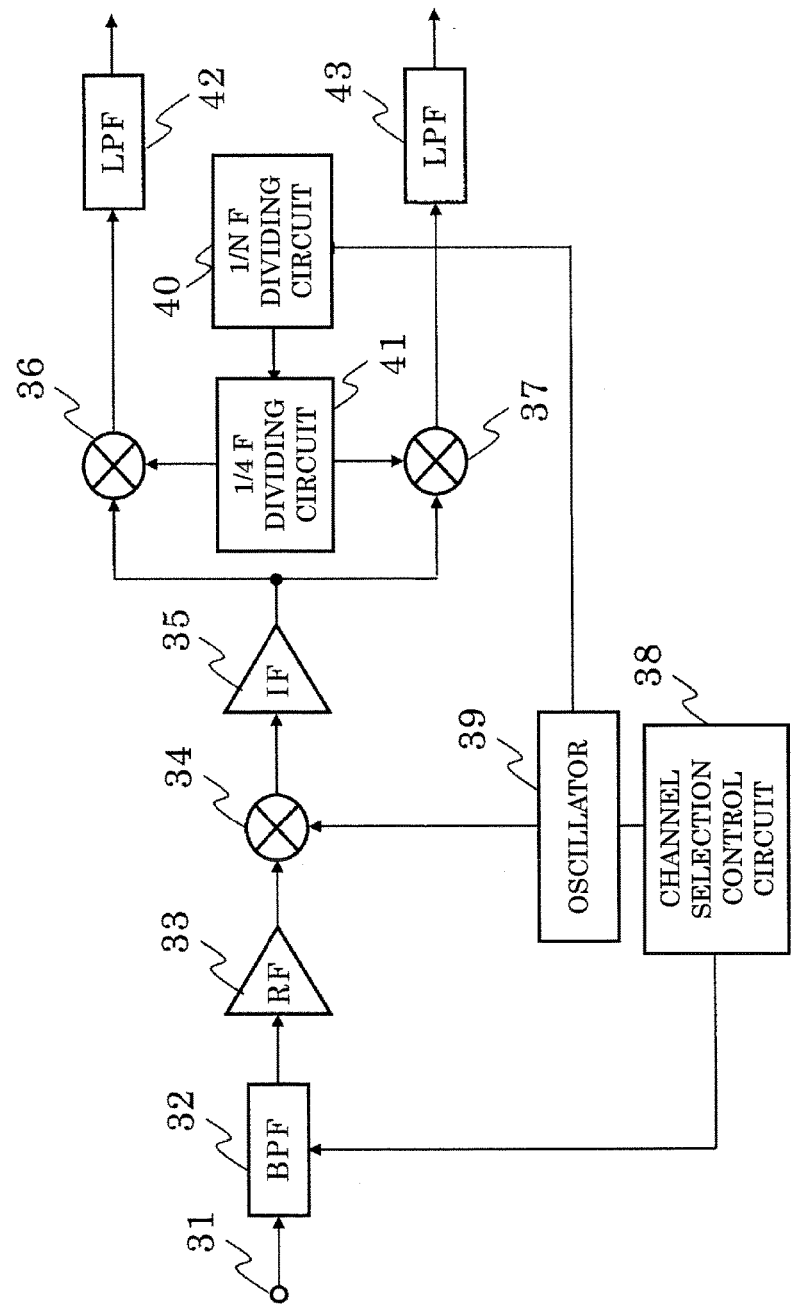
FIG. 3 is a block diagram illustrating the structure of a conventional single conversion receiver.

FIG. 2 is a block diagram illustrating the structure of the single conversion receiver of the embodiment. The block diagram in FIG. 2 illustrates the structure of a digital modulation unit from AD converters to a decoder to extract a digitally modulated signal.

The digital modulation unit includes a frequency divider 16 as a 1/N frequency divider, AD converters 17 and 18, and a digital logic circuit unit 19. The digital logic circuit unit 19 includes a decoder 21 and an automatic gain control circuit 20.

The frequency divider 16 supplies an operation clock (DCLK) to the AD converters 17 and 18 and the digital logic circuit unit 19. The operation clock (DCLK) is generated by the frequency divider 16 dividing the frequency of the oscillation signal (F_XTL) of the oscillator 8 by N (where N is a positive integer).

The AD converters 17 and 18 convert the baseband signal (BI2) and the baseband signal (BQ2) to a digital baseband signal (BI3) and a digital baseband signal (BQ3), respectively. The decoder 21 performs arithmetic processing on the digital baseband signal (BI3) and the digital baseband signal (BQ3) to extract the digitally modulated signal.

The automatic gain control circuit 20 (AGC) detects reception strength to generate a signal AG as an automatic gain control signal from the digital baseband signal (BI3) and the digital baseband signal (BQ3). The signal AG is input to the amplifier 3 and the amplifier 6 to control gain so that the amplifier 3 and the amplifier 6 will not be saturated.

The single conversion receiver of the embodiment can obtain the operation clock (DCLK) for the AD converters 17, 18 and the digital logic circuit unit 19, merely using the frequency divider 16 dividing the frequency of the oscillation signal (F_XTL) of the oscillator 8 by N. Since the frequency divider 16 can be a counter composed of flip-flops, the circuit size is small and power consumption is reduced.

When the symbol rate (symbol frequency) of a modulated signal is denoted by SR, a further feature of the single conversion receiver of the embodiment is that the symbol rate SR is $2^M/(N \cdot P)$ times the intermediate frequency signal (F_IF) (where P is an integer of 2 or more).

$$SR = (F\_IF) 2^M / (N \cdot P) \quad (2)$$

For example, when the center frequency of the bandpass filter 5 is 10.7 MHz, M=2, N=64, and P=8, the symbol rate SR is 83.59375 kHz, the operation clock DCLK is 668.75 kHz (eight times as much as SR), and the oscillation signal (F_XTL) of the oscillator 8 is 42.8 MHz (512 times as much as SR).

In other words, in the single conversion receiver of the embodiment, since the dividing numbers of the frequency divider 13 and the frequency divider 16 are multiples of 2, the circuit sizes of the frequency dividers 13 and 16 can be made small. Further, the relationship between the modulation symbol rate SR and the operation clock (DCLK) becomes an integer ratio. Compared with a case where the ratio between the symbol rate SR and the sampling frequency of the AD converters 17 and 18 is indivisible upon decoding, since this eliminates the need for an extra operation to adjust decimals, the size of the digital logic circuit unit 19 can be reduced, and hence current consumed for decoding can be reduced.

As described above, the single conversion receiver of the embodiment has good receiving sensitivity characteristics and enables reduction in manufacturing cost and power consumption due to the reduction in circuit size.

It will be obvious that the same effect can be obtained even in a transceiver using the single conversion receiver of the embodiment and a transmitting and receiving system using multiple transceivers. Even in the whole of such a system, the reduction in manufacturing cost and power consumption due to the reduction in circuit size is possible.

What is claimed is:
1. A single conversion receiver comprising:
 a first bandpass filter that lets only a desired band of a received RF signal pass through;
 a first mixer that converts the RF signal passing through the first bandpass filter into a first intermediate frequency signal;
 a second bandpass filter that lets only a band of a desired frequency channel of the first intermediate frequency signal pass through;
 a quadrature demodulator that converts the first intermediate frequency signal to baseband signals composed of an I phase and a Q phase;

an oscillator that generates a first local signal $2^M$ times a center frequency of the second bandpass filter, where M is an integer;

a fractional-N PLL frequency synthesizer that generates a second local signal with a frequency non-integer times the first local signal and supplies the second local signal to the first mixer; and a first frequency divider that divides a frequency of the first local signal by $2^M$ to generate a third local signal and a fourth local signal having 90 degree phase difference from the third local signal, and supplies the third local signal and the fourth local signal to the quadrature demodulator.

2. The receiver according to claim 1, further comprising:

a first analog to digital (AD) converter that AD-converts the I-phase baseband signal and outputs a first digital baseband signal;

a second AD converter that AD-converts the Q-phase baseband signal and outputs a second digital baseband signal;

a second frequency divider that supplies a fifth local signal, obtained by dividing a frequency of the first local signal by N, where N is an integer, to the first and second AD converters as a sampling clock; and a decoder that receives the first and second digital baseband signals as inputs, and outputs a digitally modulated signal.

3. The receiver according to claim 2, wherein a symbol rate of the digitally modulated signal is set to be $2^M/(N \cdot P)$ times the center frequency of the second bandpass filter, where P is an integer of 2 or more.

4. A communication system comprising the receiver according to claim 1.

* * * * *